United States Patent [19]

Overweg et al.

[11] Patent Number: 5,396,208
[45] Date of Patent: Mar. 7, 1995

[54] MAGNET SYSTEM FOR MAGNETIC RESONANCE IMAGING

[75] Inventors: Johannes A. Overweg; Gerardus N. Peeren, both of Eindhoven, Netherlands

[73] Assignee: U.S. Philips Corporation, New York, N.Y.

[21] Appl. No.: 957,469

[22] Filed: Oct. 6, 1992

Related U.S. Application Data

[63] Continuation of Ser. No. 711,473, Jun. 5, 1991, abandoned.

[30] Foreign Application Priority Data

Jun. 8, 1990 [NL] Netherlands ............... 9001300

[51] Int. Cl.$^6$ ................................. G01V 3/00
[52] U.S. Cl. ..................... 335/301; 335/216; 335/296; 335/299; 324/319
[58] Field of Search ............ 335/216, 296, 299, 301; 324/318, 319, 320

[56] References Cited

U.S. PATENT DOCUMENTS

| | | | |
|---|---|---|---|
| 4,587,504 | 5/1986 | Brown et al. | 335/216 |
| 4,698,611 | 10/1987 | Virmilyea | 335/298 |
| 4,710,741 | 12/1987 | McGinley | 335/296 |
| 4,768,009 | 8/1988 | Shimada | 335/299 |
| 4,771,243 | 9/1988 | Vreugdenhil et al. | |
| 4,890,082 | 12/1989 | Fujita | 335/301 |
| 4,924,185 | 5/1990 | Matsutani | 324/319 |
| 4,968,961 | 11/1990 | Miyajima | 335/216 |
| 4,983,922 | 1/1991 | Tahara | 324/320 |
| 5,001,447 | 3/1991 | Jayakumar | 335/299 |
| 5,136,273 | 8/1992 | Ohta | 335/301 |

FOREIGN PATENT DOCUMENTS

| | | | |
|---|---|---|---|
| 0160350 | 10/1985 | European Pat. Off. | G01N 24/06 |
| 60-151545 | 8/1985 | Japan . | |
| 0016604 | 1/1988 | Japan | 335/299 |
| 08126 | 10/1988 | WIPO . | |

Primary Examiner—Leo P. Picard
Assistant Examiner—R. Barrera
Attorney, Agent, or Firm—Edward Blocker; Bernard Franblau

[57] ABSTRACT

An extremely efficient magnet system having a comparatively large angle of aperture can be obtained for magnetic resonance imaging by a reduction of fields of all orders in a common approach affecting active and passive as well as positive and negative oriented coil elements. Passive soft-magnetic ring segments are arranged in two pairs and located within a plurality of larger diameter active magnetic coils. The active coils include a central coil and outer coils wherein the outer coils are smaller than the central coil. The coils are in a helium Dewar vessel and arranged such that the system has an aperture of about 90°. The central active coil may have a larger radius than the smaller outer coils.

13 Claims, 1 Drawing Sheet

MAGNET SYSTEM FOR MAGNETIC RESONANCE IMAGING

This is a continuation of application Ser. No. 07/711,473, filed Jun. 5, 1991, now abandoned.

FIELD OF THE INVENTION

This invention relates to a magnet system, comprising a plurality of coaxially arranged magnet coils for generating a steady magnetic field in a measuring space of a magnetic resonance imaging apparatus.

BACKGROUND OF THE INVENTION

A magnet system of this kind is known from U.S. Pat. No. 4,771,243.

A steady magnetic field B generated by a coaxial coil system and extending along an axis $\dot{Z}$ of the magnet system generally satisfies:

$$B = Q_0 Z^0 + A_1 Z^1 + A_2 Z^2 + A_3 Z^3 + A_4 Z^4 + A_5 Z^5 + A_6 Z^6 + \ldots$$

Coil systems for magnetic resonance imaging apparatus are customarily designed so that no odd-order terms occur in the magnetic field. In practical magnets this is usually achieved by constructing the coil system using coils which are symmetrically arranged with respect to a central plane and by activating all of the coils in the same sense. Furthermore, known coil systems are designed so that second-order and fourth-order contributions to the magnetic field are negligibly small in a measuring space to be selected. This condition limits the degree of freedom as regards the positioning of magnet coils of the magnet system with respect to one another in the axial direction, so that a minimum length to diameter ratio is imposed thereon. It is to be noted that in a practical magnet system the length increases and the effective diameter decreases due to necessary minimum dimensions of the cryostat to be used. U.S. Pat. No. 4,771,243 incorporated by reference herein describes how, using ferromagnetic rings, higher-order field contributions, i.e. in this case sixth-order and higher-order fields, are reduced so that a magnetic field having adequate spatial field homogeneity is realized in a measuring space. According to this patent a field correction, achieved by means of magnetic material, is used to realized an improved field homogeneity in the measuring space. It is to be noted that the field correction can also be used for reducing the length of the magnet system. The condition that a second-order and fourth-order field contribution of the coil system must be negligibly small is a serious limitation to efforts to reduce the length of the magnet system.

A short magnet system is described in EP 160 350. Such a system is realized by constructing a magnet system using concentrically situated coils and by activating these coils with respect to one another so that a measuring space with a spatially homogeneous steady magnetic field is created. However, such a magnet system is inefficient and hence less suitable for generating comparatively strong steady magnetic fields.

SUMMARY OF THE INVENTION

It is an object of the invention to mitigate the above drawbacks; to achieve this, a magnet system of the kind set forth in accordance with the invention comprises active and passive magnet coil elements for forming mutually oppositely oriented magnetic fields which locally compensate for higher-order field contributions.

Because inter alia, the condition as regards the second-order and fourth-order field contributions is ignored in a magnet system in accordance with the invention, a substantially shorter magnet system comprising substantially coaxially arranged coil elements can be realized. Therefore, hereinafter a magnet system will be described which has a substantially larger angle of aperture, which angle is defined as a maximum aperture of a cylindrical open space of the magnet, viewed from a magnet centre.

In a preferred embodiment the passive coil elements are formed by ring-segment elements of ferromagnetic material. By adapted positioning of the elements, excessively strong magnetic fields are locally compensated for thereby. The ferromagnetic material may also be provided in the form of a number of loose, for example, straight elements.

A further preferred embodiment comprises active coil elements which can be activated in a mutually opposed sense and which have corresponding functions. When active coil elements which are symmetrically arranged with respect to a central plane are activated in the same sense, the occurrence of odd-order terms in the magnetic field can be avoided.

When passive coil elements are mounted within active coil elements, at least viewed in a radial sense, a larger angle of aperture can be realized for the magnet system because passive coil elements do not require thermal insulation, for example, in the form of a Dewar vessel. The angle of aperture amounts to at least approximately 45°. In order to design an optimum angle of aperture, a passive element which is situated furthest outwards in the axial direction is preferably situated within a surface of a cone through a central point of the magnet system and within a furthest outwards situated shield of an active coil element.

A further preferred embodiment comprises two axially extremely situated active coil elements which are to be activated in the same sense and also comprises a centrally situated coil element which is to be activated in the opposite sense. A different radius can be imparted to the extreme coils on the one side and the central coil on the other side. In a preferred embodiment, four passive elements in the form of rings of magnetic material are added to the described system. The magnetic rings have a diameter of, for example, from 0.5 to 0.7 times (preferably less than 0.8 times) the inner diameter of the active coils. In a preferred embodiment the length-to-diameter ratio of a central pair of rings is, for example, approximately 0.4 and that of an outer pair of rings is approximately 0.8. The length-to-diameter ratio of the coil system as a whole may be, for example, approximately 0.6 or less. The pairs of rings need not have the same diameter, it being possible to adapt the cross-section of the rings to desired field contributions or mounting conditions. Moreover, portions of rings or additional rings of passive elements can be mounted so that they can be trimmed, i.e. adjustable to a slight degree in an extremely controlled manner, so axially displaceable in practical cases, or they may contain ferromagnetic material that can be replaced.

In order to achieve a stray field reduction in a further preferred embodiment, the diameter of a centrally disposed active coil element is chosen such that it can be activated using approximately 30% of the number of ampère-turns of each of the outer coils. Depending on the geometry of the passive elements, the diameter of the central coil then amounts to approximately 1.5 times that of the outer active coil elements. The dimension of a coil system in accordance with the invention can be scaled up or down to a high degree, scaling taking place substantially along radians from the coil center. For the sake of stability all coils of notably superconducting magnet systems are connected in series.

BRIEF DESCRIPTION OF THE DRAWING

Some preferred embodiments in accordance with the invention will be decribed in detail hereinafter with reference to the drawing. Therein.

DESCRIPTION OF THE PREFERRED EMBODIMENTS

Figure 1:
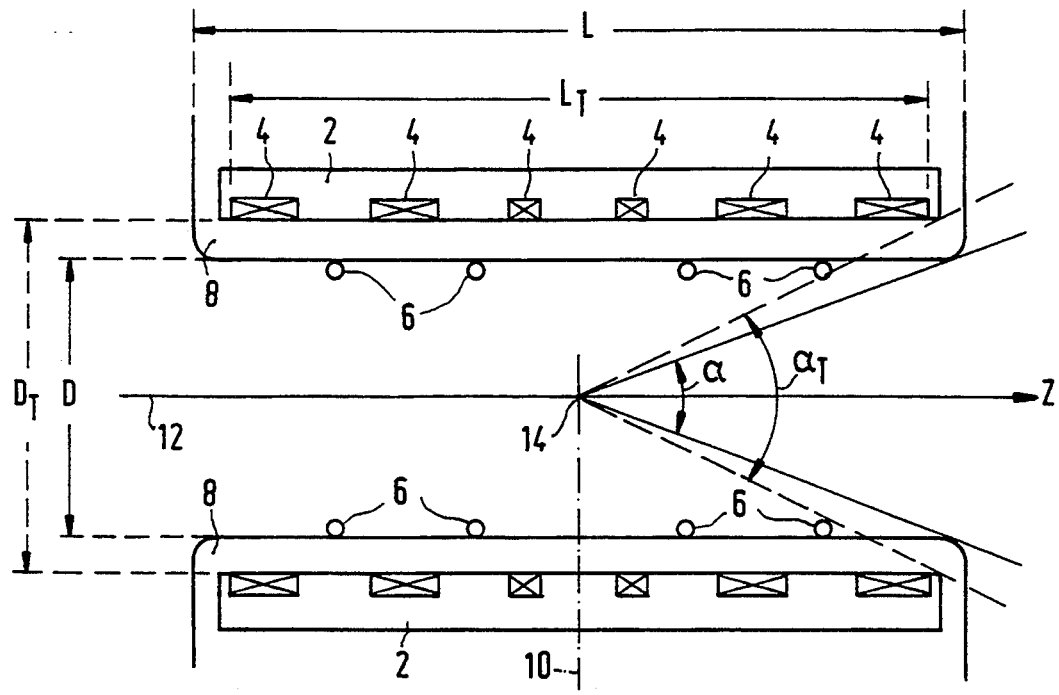
FIG. 1 diagrammatically shows a magnet system of a magnetic resonance imaging apparatus.

A magnet system for a magnetic resonance imaging apparatus as shown in FIG. 1 comprises a coil former 2 with electromagnetic coils 4, also referred to as active coil elements hereinafter, and magnetizable coil elements 6, for example consisting of rings or ring segments of a ferromagnetic material such as iron, also referred to as passive magnetic coil elements hereinafter. Around the coil former 2 there is provided a shield 8, for example, for electrical insulation, for thermal insulation or for both. In customary superconducting magnets, a helium Dewar vessel forms part of the shield and is, therefore, comparatively thick because of the necessity of, for example thermal shields to be evacuated. When use is made of high Tc superconducting current conductors, cooling can be realized, for example, by liquid nitrogen so that the shielding volume can be reduced, be it only slightly. Such a coil system customarily has a circular-cylindrical construction which is mirror-symmetrical with respect to a symmetry plane 10 extending transversely of an axis 12 and through a coil center 14. A theoretical length-to-diameter ratio of such a coil system is given by a diameter $D_T$ of the active coil elements 4, or at least of the extremely outwards situated coil elements, and a length $L_T$ measured between the axial ends of the outer active coil elements 4. These dimensions result in a theoretical angle of aperture $\alpha_T$ for the magnet system. In a practical magnet system, a length L, a diameter D and an angle of aperture $\alpha$ are as indicated.

Figure 2:
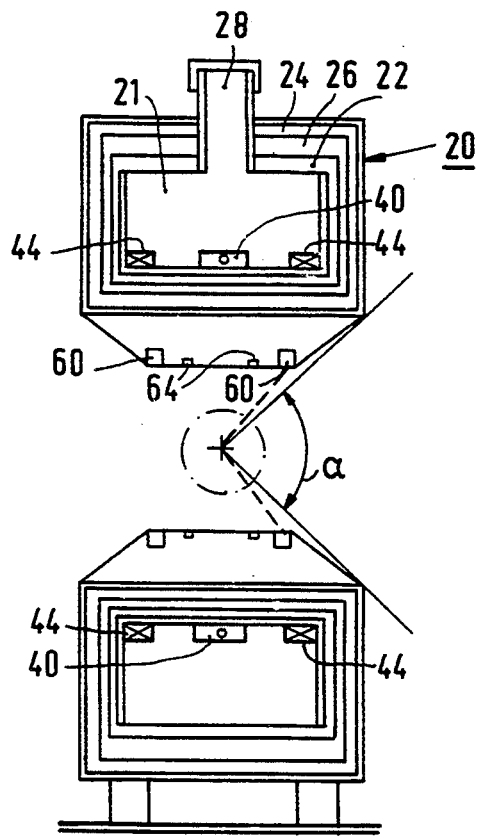
FIGS. 2 and 3 show embodiments of magnet systems in accordance with the invention.

A preferred embodiment of a superconducting magnet system in accordance with the invention, as shown in FIG. 2 comprises three active coil elements comprising a central coil 40 and outer coils 44. The coils are accommodated in a helium Dewar vessel 20 which in this case comprises two vacuum walls 22 and 24 and a nitrogen wall 26. The helium space 21 is provided with an opening 28 for replenishing the liquid helium. It is to be noted that a coil system as described thus far will exhibit second-order local magnetic field terms and fourth-order with, for example, a positive second-order deviation calculated from the system center. The central coil 40 may alternatively be subdivided into two coil halves which are preferably symmetrically arranged with respect to the symmetry plane 10. However, in this context it is not the object to eliminate the second-order and fourth-order fields in such a manner. In the described embodiments two pairs of magnetizable passive coil elements 60 and 64 which may be ring segments of soft magnetic material and having a substantially smaller radius than the coils 40 and 44 are included in the magnet system. The coil elements 60 and 64 together provide an optimum uniform magnetic field in a measuring space the inner pair 60 has an axial portion-to-ring radius of about 0.4 and the outer pair 60 about 0.8. The passive elements are constructed so as to be capable of being trimmed. Such a coil design has an angle of aperture $\alpha$ of at least 90°, for example for a measuring space having a diameter D of, for example 20 cm. In the present configuration the current direction in the outer coils 44 opposes that in the central coil 40 with, for example, approximately 80,000 ampère-turns for the central coil and, for example, approximately 250,000 ampère turns for the outer coils. The outer axially located passive magnetic coil elements 60 have the same or larger angle of aperture as that of the shield 20 for the active magnet coils 40, 44. The angle of aperture of the passive coil element 60 is shown by the dashed lines and for the shield by the angle $\alpha$.

Figure 3:
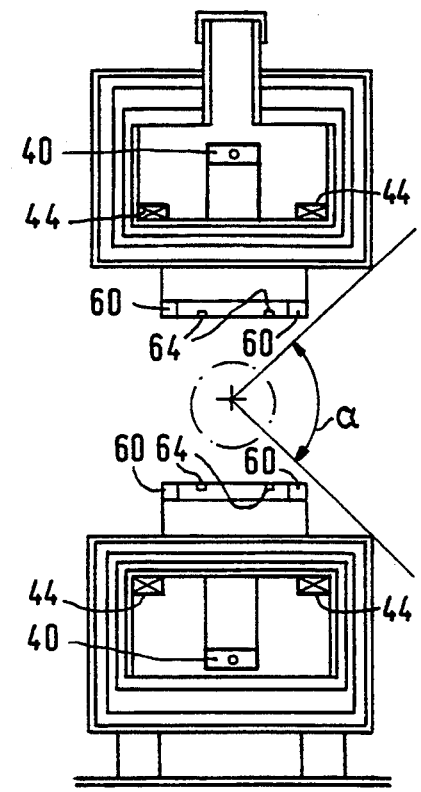

FIG. 3 shows a coil system having a greatly reduced external stray field. Therein, a substantially larger radius is imparted to a central coil 40 and the number of ampère-turns thereof has been increased to, for example, approximately 350,000 in order to bring the field contribution thereof to the desired level. The number of ampère-turns of the outer coils 44, having the opposite direction, is approximately 30,000. Even though not shown in the diagrammatic representation, the position, the geometry and the iron content of the passive coil elements have been adapted to the new coil construction in order to optimize field homogeneity. Such a magnet system has approximately the same angle of aperture and permissible measuring volume as the magnet system shown in FIG. 2 and its construction as regards Dewar vessel and shields is also similar. On the basis of the idea of the invention, magnet systems can also be designed for which the symmetry with respect to the symmetry plane 10 is no longer taken into account, for example, by imparting a deviating diameter to coil elements, passive or active, on one side of the symmetry plane. Thus, a magnet system can be designed which need not be larger for an equal or larger measuring volume. Such a measuring volume is in that case accessible, for example, from one side only, or may even be completely closed on one side so that it is particularly suitable for examination of peripheral parts of patients, such as arms (hands), legs (feet) and the head.

What is claimed is:

1. A magnet system for generating a steady magnetic field in a measuring space of a magnetic resonance imaging apparatus, comprising: a coil system including a plurality of coaxial active magnet coils, a plurality of passive magnetic coil elements comprising closed ring elements forming uninterrupted ring-shaped paths of soft ferromagnetic material which have a diameter less than 0.8 than the inner diameter of said coil system, the passive magnetic coil elements being arranged so as to reduce second-order and higher-order local field contributions of the active magnet coils, said system including means for activating said active magnet coils in a mutually opposed sense for reducing external stray field that otherwise might occur, at least one of the active magnet coils activated in one sense being central to at least two outer active magnet coils activated in the opposing sense, wherein when viewed radially, the passive magnetic coil elements are mounted substantially within the active coil elements, and the magnet system has a central angle of aperture (α) which is at least approximately 45° and a shield positioned between the active magnet coils and the passive magnetic coil elements such that the angle of aperture of an axially outer active magnet coil is greater than the angle of aperture of the shield.

2. A magnet system as claimed in claim 1 wherein said passive coil elements include an axially outer passive magnetic coil element with the same or larger angle of aperture as that of the shield.

3. A magnet system as claimed in claim 2 wherein, when viewed radially, the passive magnetic coil elements are mounted substantially within tile active coil elements.

4. A magnet system as claimed in claim 1 wherein for stray field compensation, the diameter of the central active magnet coil is substantially larger than that of the two outer active magnet coils and has a plurality of ampere-turns which provide said stray field compensation.

5. A magnet system as claimed in claim 1 wherein an axially outer passive magnetic coil element forms an angle of aperture ($\alpha_T$) which is at least approximately 45°.

6. A magnet system as claimed in claim 1 wherein an axially outer active magnet coil forms an theoretical angle of aperture ($\alpha_T$) which is at least approximately 45°.

7. A magnet system as claimed in claim 1 wherein said passive magnetic coil elements include an axially outer passive magnetic coil element with the same or larger angle of aperture as that of the shield.

8. A magnet system for generating a steady magnetic field in a measuring space of a magnetic resonance imaging apparatus comprising: a plurality of coaxial active magnet coils arranged to provide a wide aperture angle but which produce in the measuring space a magnetic field with significant second order and fourth order local field contributions, a plurality of passive magnetic coil elements arranged so that the combined effect of the active magnet coils and the passive magnetic coil elements together produce a magnetic field in the measuring space in which said second order, fourth order and higher order local field contributions of the active magnet coils are substantially reduced, and wherein said plurality of active magnet coils comprise, in the axial direction of the magnet system, two outer active magnet coils energized in the same sense and a central active magnet coil energized in the opposite sense relative to the two outer active magnet coils.

9. A magnet system as claimed in claim 8 wherein the diameter of the central active magnet coil is approximately 1.5 times the diameter of the two outer active magnet coils and the central active magnet coil is energized with approximately 30% of the ampere-turns energizing the two outer active magnet coils.

10. A magnet system as claimed in claim 8 wherein said passive magnetic coil elements comprise closed ferromagnetic ring elements mounted within the active magnet coils when viewed in the radial direction, and the diameter of the ferromagnetic ring elements is 0.5 to 0.7 times the inner diameter of the active magnet coils.

11. A magnet system as claimed in claim 8 further comprising: a shield for the active magnet coils, and wherein said passive coil elements include an axially outer passive magnetic coil element with the same or larger angle of aperture as that of the shield for the active magnet coils.

12. A magnet system for generating a steady magnetic field in a measuring space of a magnetic resonance imaging apparatus, comprising a plurality of coaxial active magnet coils and a plurality of passive magnetic coil elements comprising closed ring elements forming uninterrupted ring-shaped paths of ferromagnetic material, wherein said passive elements include two pairs of passive coil elements with an axial-length-to-ring-radius ratio of approximately 0.4 for, as viewed along an axial direction of the magnet system, an inner pair of passive coil elements and approximately 0.8 for an outer pair of passive coil elements, the passive magnetic coil elements being arranged for reducing second-order and higher-order local field contributions of the active magnet coils, said system including means for activating said active magnet coils in a mutually opposed sense for reducing external stray field that otherwise might occur, at least one of the active magnet coils activated in one sense being central to at least two outer active magnet coils activated in the opposite sense.

13. A magnet system for generating a steady magnetic field in a measuring space of a magnetic resonance imaging apparatus, comprising: a coil system including a plurality of coaxial active magnet coils, a plurality of passive magnetic coil elements comprising closed ring elements forming uninterrupted ring-shaped paths of ferromagnetic material, the passive magnetic coil elements being arranged so as to reduce second-order and higher-order local field contributions of the active magnet coils, said system including means for activating said active magnet coils in a mutually opposed sense for reducing external stray field that otherwise might occur, at least one of the active magnet soils activated in one sense being central to at least two outer active magnet coils activated in the opposing sense, and wherein the magnet system has a central angle of aperture (α) which is at least approximately 45°, and said passive elements include two pairs of passive magnetic coil elements wherein one pair is inner and the other pair outer as viewed along an axial direction relative to a reference position, said elements having an axial-length-to-ring-radius ratio of approximately 0.4 for the inner pair and approximately 0.8 for the outer pair.

* * * * *